(12) United States Patent
Kozko et al.

(10) Patent No.: US 9,497,367 B1
(45) Date of Patent: Nov. 15, 2016

(54) MAXIMIZING EFFECTIVE SURFACE AREA OF A RECTANGULAR IMAGE SENSOR CONCURRENTLY CAPTURING IMAGE DATA FROM TWO LENSES

(71) Applicant: IC REAL TECH, INC., Pompano Beach, FL (US)

(72) Inventors: Dmitry Kozko, Aventura, FL (US); Ivan Onuchin, Hollywood, FL (US)

(73) Assignee: IC REAL TECH, INC, Pompano Beach, FL (US)

( * ) Notice: Subject to any disclaimer, the term of this patent is extended or adjusted under 35 U.S.C. 154(b) by 0 days.

(21) Appl. No.: 14/861,213

(22) Filed: Sep. 22, 2015

Related U.S. Application Data

(60) Provisional application No. 62/195,503, filed on Jul. 22, 2015.

(51) Int. Cl.
*H04N 5/225* (2006.01)
*H01L 27/146* (2006.01)
*H01L 31/0232* (2014.01)
*G06K 9/20* (2006.01)

(52) U.S. Cl.
CPC ...... *H04N 5/2254* (2013.01); *H01L 27/14625* (2013.01); *H01L 27/14627* (2013.01); *H01L 31/0232* (2013.01); *G06K 9/209* (2013.01)

(58) Field of Classification Search
CPC .............. H04N 5/2254; H04N 5/2258; H01L 27/14625; H01L 27/14627; H01L 31/0232

USPC .................................. 348/345; 359/619, 628
See application file for complete search history.

(56) References Cited

U.S. PATENT DOCUMENTS

| | | | | |
|---|---|---|---|---|
| 9,231,004 | B2 * | 1/2016 | Nagata | H01L 27/14601 |
| 9,357,116 | B1 * | 5/2016 | Kozko | G02B 27/0025 |
| 2004/0001145 | A1 * | 1/2004 | Abbate | H04N 5/2254 348/207.99 |
| 2009/0047995 | A1 * | 2/2009 | Futter | H04N 5/225 455/556.1 |
| 2013/0258044 | A1 * | 10/2013 | Betts-Lacroix | H04N 13/0242 348/36 |
| 2014/0192238 | A1 * | 7/2014 | Attar | H04N 5/2226 348/252 |
| 2015/0181089 | A1 * | 6/2015 | Mirlay | G02B 27/1066 348/46 |
| 2016/0182777 | A1 * | 6/2016 | Laroia | H04N 5/2252 348/374 |

* cited by examiner

*Primary Examiner* — Ngoc-Yen Vu
(74) *Attorney, Agent, or Firm* — Patents on Demand P.A.; Brian K. Buchheit; Scott M. Garrett

(57) ABSTRACT

A rectangular image sensor can be present within an optical capture device. Two lenses can capture and direct light from the real world environment upon the image sensor. The light from each of the two lenses can be concurrently directed to the same rectangular image sensor. Each of the two lenses can produce a corresponding image circle simultaneously on the rectangular image sensor. An area of the image circles from the two lenses can be non-overlapping. The image sensor can be a device which converts light within the real world environment into electronic signals.

20 Claims, 4 Drawing Sheets

US 9,497,367 B1

MAXIMIZING EFFECTIVE SURFACE AREA OF A RECTANGULAR IMAGE SENSOR CONCURRENTLY CAPTURING IMAGE DATA FROM TWO LENSES

CROSS REFERENCE TO RELATED APPLICATION

This application claims the benefit of Provisional Application No. 62/195,503, filed Jul. 22, 2015, entitled "Maximizing Effective Surface Area of a Rectangular Image Sensor Concurrently Capturing Image Data from Two Lenses". Provisional Application No. 62/195,503 is incorporated herein in its entirety.

BACKGROUND

The present invention relates to the field of multi-lens optical capture devices and, more particularly, to maximizing effective surface area of a rectangular image sensor concurrently capturing image data from two lenses.

Commercial image sensors are generally rectangular shaped due to fabrication techniques and constraints. During fabrication a relatively large rectangular surface is formed, which is subdivided into smaller rectangular geometries, each of which become an image sensor. Conventionally, a rectangular or square sensor is used as a light target for a circular (or oval) image circle from a lens. As such, there is an incongruity between the image circle from the lens (e.g., light striking image sensor) and the geometry of the sensor (e.g., rectangular). Consequently, maximizing image sensor usage has been a significant effort within the industry.

BRIEF SUMMARY

One aspect of the present invention can include an optical capture device for maximizing effective surface area of a rectangular image sensor concurrently capturing image data from two lenses. A rectangular image sensor can be present within an optical capture device. Two lenses can capture and direct light from the real world environment upon the image sensor. The light from each of the two lenses can be concurrently directed to the same rectangular image sensor. Each of the two lenses can produce a corresponding image circle simultaneously on the rectangular image sensor. An area of the image circles from the two lenses can be non-overlapping. The image sensor can be a device which converts light within the real world environment into electronic signals.

Another aspect of the present invention can include a camera module for maximizing effective surface area of a rectangular image sensor concurrently capturing image data from two lenses. A rectangular image sensor can be present within an optical capture device. Two lenses within the optical capture device can capture and direct light upon a rectangular image sensor of the optical capture device concurrently. The light from the two lenses can strike the rectangular image sensor in non-overlapping areas simultaneously. The image sensor can be a device which converts light within the real world environment into electronic signals.

Yet another aspect of the present invention can include for method maximizing effective surface area of a rectangular image sensor concurrently capturing image data from two lenses. The geometry of an image sensor within the optical capture device can be established. The geometry can include a size of the image sensor and shape of the image sensor. An image circle size can be computed for two inscribed adjacent and non-overlapping image circles produced from each of the two lenses on the image sensor. The computing can maximize the size of each of the image circles when the image circles are simultaneously present on the sensor.

DETAILED DESCRIPTION

Figure 1:
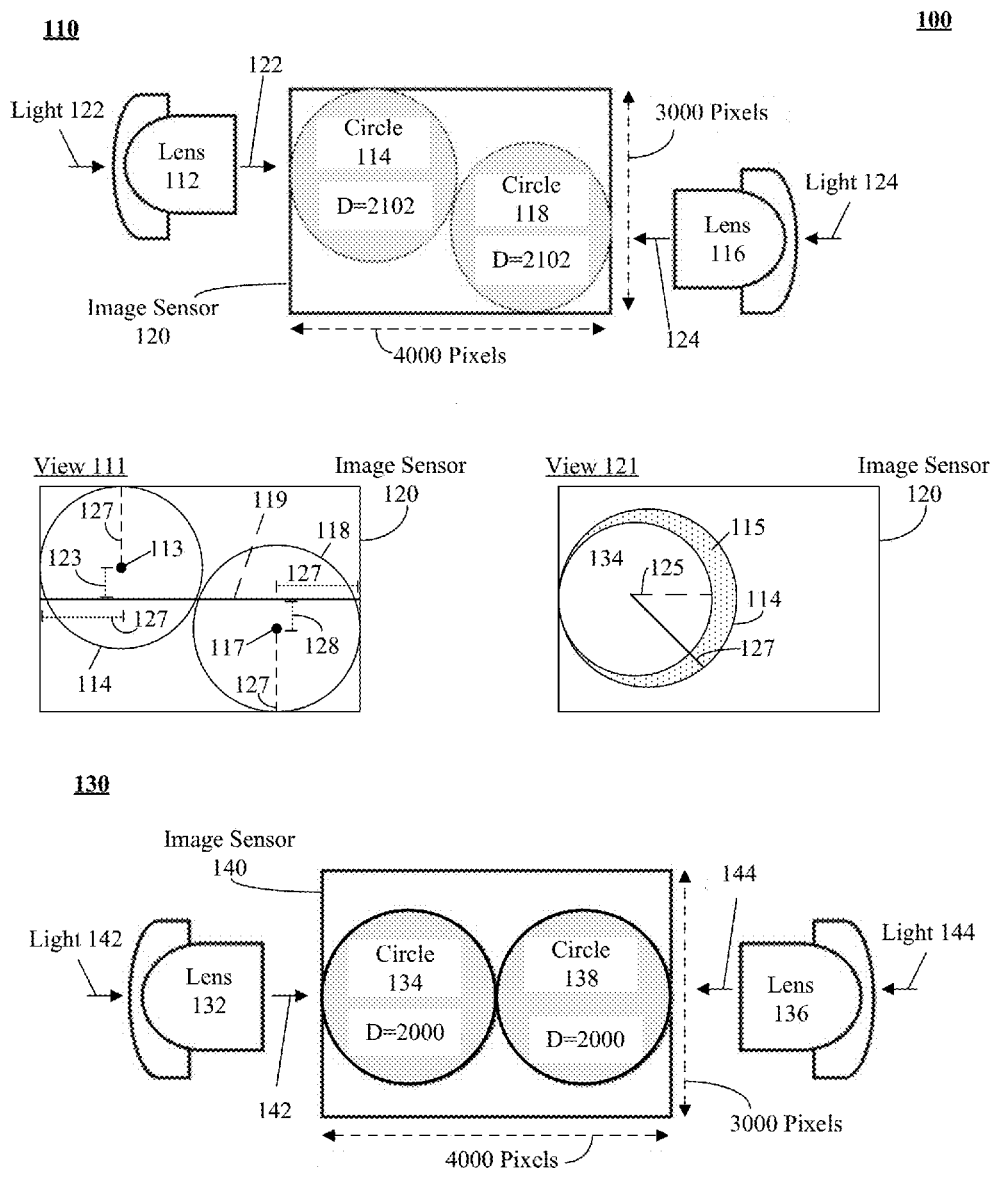
FIG. 1 is a schematic diagram illustrating a set of embodiments for maximizing effective surface area of a rectangular image sensor concurrently capturing image data from two lenses in accordance with an embodiment of the inventive arrangements disclosed herein.

The present disclosure is a solution for maximizing effective surface area of a rectangular image sensor concurrently capturing image data from two lenses. In the solution, light collected by a set of lenses can be captured onto a singular image sensor. That is, the innovation utilizes a single image sensor (e.g., rectangular in shape) for two different lenses to concurrently capture light from the two different lenses. These lenses can face opposite directions or otherwise contain image data that is non-overlapping. The areas of the image sensor upon which an image circle from each of the two lenses is non-overlapping, as well. To maximize a surface area and thereby minimizing the size of the sensor to accommodate the image circles, these circles are offset at a diagonal to one another as opposed to being centered at a center point of an edge of the sensor.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is a schematic diagram illustrating a set of embodiments 110, 130 for maximizing effective surface area of a rectangular image sensor concurrently capturing image data from two lenses in accordance with an embodiment of the inventive arrangements disclosed herein. Embodiments 110, 130 can be performed in the context of embodiments 210, 250, 310, 330, system 350 and/or embodiment 410. In embodiments 110, 130, simultaneous non-overlapping image circles can be produced upon an image sensor from two or more lenses within an optical capture device (e.g., camera with multiple opposing lenses).

As used herein, simultaneous image circles can include image circles which can occur at the same time in real-time or near real time. Simultaneous image circles can include, but is not limited to, synchronous image circles, concurrent image circles, and the like. Non-overlapping image circles can include shapes whose boundaries are tangential but non-intersecting. That is, image circles boundaries can be adjacent or non-convergent.

An image sensor 120 (e.g., imaging sensor) is a sensor that detects and conveys the information that constitutes an image. The sensor 120 can convert the variable attenuation of waves (e.g., as they pass through or reflect off objects) into signals, the small bursts of current that convey the information. The waves can be light 122, 124 or other electromagnetic radiation. Digital image sensors can include semiconductor charge-coupled devices (CCD) or active pixel sensors in complementary metal-oxide-semiconductor (CMOS) or N-type metal-oxide-semiconductor (NMOS, Live MOS) technologies. In one instance, sensor 120 can be a twelve megapixel sensor such as a 4:3 aspect ratio sensor.

Embodiment 110, 130 utilizes a single image sensor 120, 140 (e.g., rectangular in shape) for two different lenses (e.g., 112, 116 for embodiment 110 and 132, 136 for embodiment 130). These lenses 112, 116, 132, 1346 can face opposing directions (e.g., or otherwise include image data that is non-overlapping). The areas of the image sensor upon which an image circle 114, 118, 134, 138 can be formed from the light 122, 124 from each of the two lenses 112, 116, 132, 136 is non-overlapping, as well. For example, two images 114, 118 can be formed on a single image sensor 120 from two different opposing lenses 112, 116 of a multi-lens camera. To maximize a surface area and thereby minimizing the size of the sensor to accommodate the image circles, these circles are offset at a diagonal to one another as opposed to being centered at a center point of an edge of the sensor.

In other words, instead of dividing the region of the sensor into rectangular regions where the image circles from the lenses are centered at a half-way point along a length (e.g., 4000 pixel) of a sensor side (e.g., embodiment 130), the proposed arrangement is to establish a diagonal from a corner to an opposing corner of the image sensor, where the image circles are centered along the diagonal.

This arrangement maximizes the available surface area of the sensor (permitting larger image circles and/or smaller image sensor size) which maximizes pixel density while minimizing overall sensor costs. For example, the image circle in embodiment 114, 118 can have an increased diameter of 102 pixels (e.g., D=2102) over embodiment 130 (e.g., D=2000). In one embodiment, the lenses themselves are offset relative to each other, to ensure that the image circles are positioned along a diagonal off the sensor providing maximum usable area. In various embodiments, image circle can be within 1, 5, or 10 percent of an edge of the sensor's effective area.

View 111 illustrates one embodiment for offsetting image circles 114, 118 within a rectangular image sensor 120. In the view, the circle 114, 118 center 113, 117 can be offset by radius 127 from the width edge (e.g., 3000 pixels) of sensor 120 and offset by distance 123, 128 from the half-way line 119 along the width of the sensor 120. That is, the circle 114, 118 can be maximized by allowing an arbitrary offset for circle center 113, 117 based on sensor geometry.

View 121 illustrates an exemplary area 115 of a circle image 134 in comparison with image circle 114. In the comparison, an exemplary area 115 can be gained as a result of the offset of the embodiments (e.g., 110, 210, 250, 310, 330, 340, 350) within the disclosure. The offset can permit the radius (or diameter) of circle image to increase (e.g., radius 125 versus radius 127) which can lead to sensor maximization. For example, an increase in diameter of circle 114 (e.g., D=2102) by 102 pixel over circle 134 (e.g., D=2000) can yield a 9.4% increase in image circle area. That is, in the example, the disclosure can maximize image circles and decrease in unused image sensor area by 18.8%. It should be appreciated that exemplary area 115 can exaggerated for clarity and is not an actual representation of a optimization increase disclosed herein.

Drawings presented herein are for illustrative purposes only and should not be construed to limit the invention in any regard. It should be appreciated that one or more optimization equations and/or algorithms can be utilized to determine image circle size and/or position. It should be appreciated that the disclosure can include threshold values for establishing image circle position and/or size including, but not limited to, sensor effective area, image fidelity, and the like.

Figure 2:
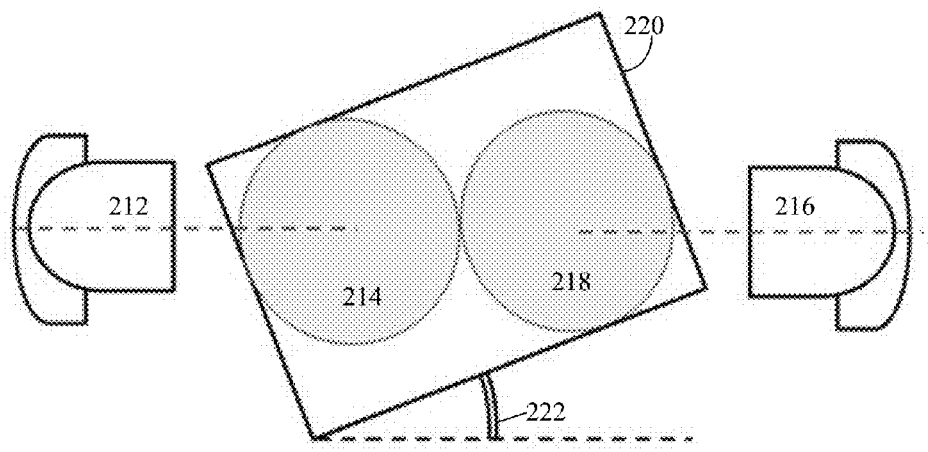
FIG. 2 is a schematic diagram illustrating a set of embodiments for maximizing effective surface area of a rectangular image sensor concurrently capturing image data from two lenses in accordance with an embodiment of the inventive arrangements disclosed herein.
Figure 2:
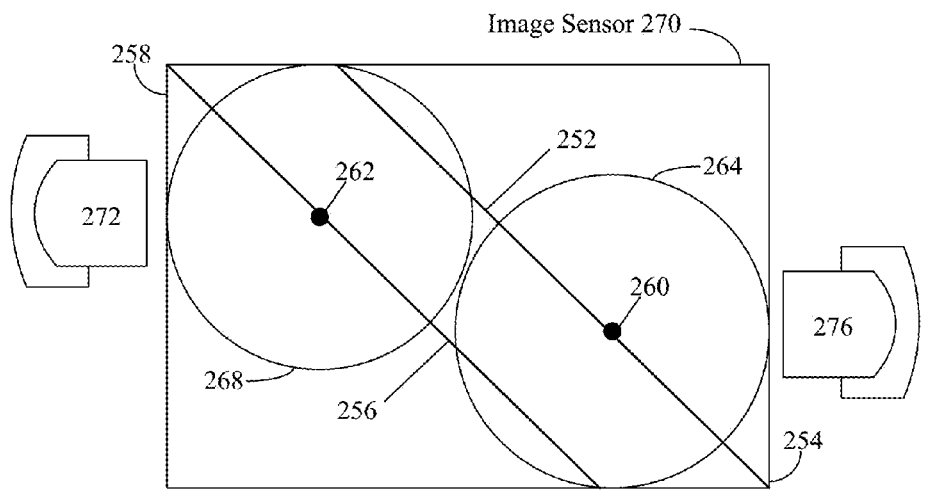

It should be appreciated that image sensor 120 can be an exemplary sensor and the disclosure is not limited to the exact sensor geometry. It should be appreciated that sensor properties can include pixel resolution (e.g., number of pixels), effective area, sensor efficiency, spectral properties, and the like. For example, sensor 120 can be a FIG. 2 is a schematic diagram illustrating a set of embodiments 210, 250 for maximizing effective surface area of a rectangular image sensor concurrently capturing image data from two lenses in accordance with an embodiment of the inventive arrangements disclosed herein. Embodiments 210, 250 can be performed in the context of embodiments 110, 130, 310, 330, system 350 and/or embodiment 410.

In embodiment 210, the lenses 212, 216 can be positioned along a center line, where the sensor is placed at an angle 222 (e.g., rotated around a vertical axis), such that the center of the image circles align with a corner-to-corner diagonal line across the image sensor. For example, the lenses 212, 216 can be positioned at a 45 degree angle from a horizontal plane 224 (e.g., askew) instead of aligned to the width of the sensor 220.

In embodiment 250, the lenses 272, 276 can be positioned along two arbitrary diagonal lines 252, 256, where the diagonal 252 extends from a corner 254 and the diagonal 256 extends from corner 258 such that the center of the image circles 260, 262 lie on the diagonal line 252, 256 across the image sensor 270.

Figure 3:
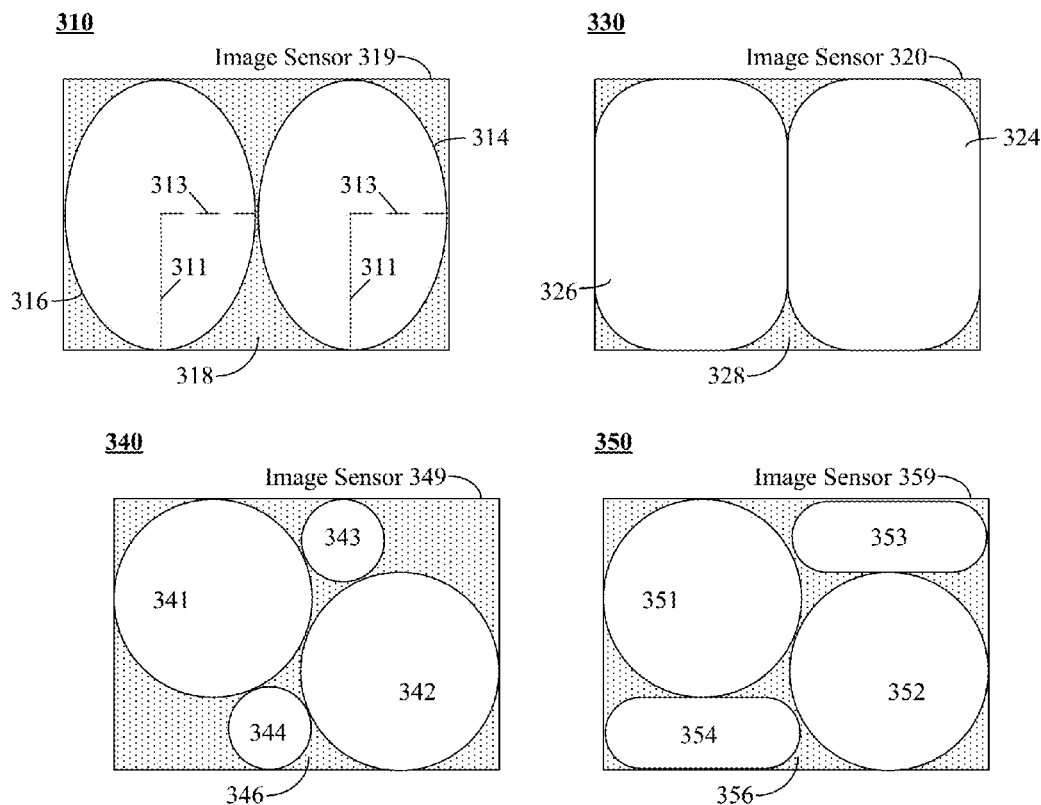
FIG. 3 is a schematic diagram illustrating a set of embodiments and a system for maximizing effective surface area of a rectangular image sensor concurrently capturing image data from two lenses in accordance with an embodiment of the inventive arrangements disclosed herein.

FIG. 3 is a schematic diagram illustrating a set of embodiments 310, 330 and a system 350 for maximizing effective surface area of a rectangular image sensor concurrently capturing image data from two lenses in accordance with an embodiment of the inventive arrangements disclosed herein. Embodiments 310, 330 and system 350 can be performed in the context of embodiments 110, 130, 210, 250 and/or 410.

Although the image circle is described and shown as a circle herein (e.g., which is common practice in the industry) some distortions of this shape are possible and are within scope of the innovation. For example, the "image circle" can be a mathematical ellipse shape (e.g., oval) or a rounded rectangle.

As defined herein, an ellipse can be a curve on a plane surrounding two focal points such that the sum of the distances to the two focal points is constant for every point on the curve. A circle can be a special circumstance of an ellipse (e.g., where the two focal points of the ellipse are positioned at the same point). When an ellipse is used (e.g., not a circle) with the innovation, either one of the ellipse's focal points for each image circle can fall on (+/−5 percent) the diagonal between the corner of the sensor.

As used herein, a rectangle can be any four sided Euclidian polygon with four right angles. Rectangle can include a special instance such as a square. In one instance, the rectangle can include a rounded rectangle which can be a rectangle with rounded corners.

In embodiment 310, 330, intentional distortion of the image circles can further maximize the usage of an image sensor 319, 320 area. Distortion can yield lower image quality (e.g., due to pixel resolution loss), but additional software and/or hardware fidelity corrections can be applied to lessen the image quality loss. For example, for an image circle, image pixel resolution can be 1:1 and for a distorted image resolution can be 1:0.7 resulting in a loss of image resolution/quality which can be corrected with smoothing functions and/or noise reduction algorithms. It should be more traditional and/or proprietary light manipulation techniques can be utilized to distort image circles and/or optical pathways from lenses to sensor surface.

In one instance, when panoramic images are formed from distorted circles such as an ellipse, the edges where distortion can be significant, the edges can be interpolated during stitching to enhance edge quality. That is, pixel data from each edge can be utilized to enhance the other which can improve overall edge fidelity.

In embodiment 310, an image circle 314, 316 can conform to an elongated circle (e.g., ellipse, oval) enabling maximization of sensor 319 usage. In the embodiment, the elongated circle 314, 316 can have a major axis 311 and a minor axis 313.

In embodiment 330, an image circle 324, 326 can be further distorted into a rounded rectangle 324, 326 enabling optimization of sensor 320 usage. In the embodiment, the rounded corners of rectangle 324, 326 can allow for further maximization of sensor 320 utilization.

From a manufacturing perspective, the sensor's effective area can include manufacturing flaws without affecting performance, so long as these flaws are located within an area of the sensor that is not a target for the image circle (e.g., area 318, 328). Thus, defective sensors with strategically placed defects can be utilized for maximum effect, further minimizing costs as often any defective regions of a sensor during fabrication results in that sensor rectangle being deemed defective and unusable.

In embodiment 340, additional lenses can direct image circles upon the same sensor 349. For example, an image circle from an additional two lenses can be positioned within a non-overlapping area (e.g., area 346) on the image sensor. In such a case, the original two image circles 341, 342 can be maximized, where the additional two image circles 343, 344 can be smaller and of lower pixel density. This arrangement is reasonable given that multi-lens devices (e.g., smartphones) often include multiple lenses of different resolutions. Further, in stereoscopic situations, where additional lenses are needed for depth calculations, the image density (e.g., pixel count) may be inconsistent with a primary image, yet retain the same effective utility. For example, GOOGLE'S PROJECT TANGO utilizes multiple cameras (e.g., front and back) along with infrared depth sensors. As used herein, the depth sensors and/or additional camera lenses used to determine depth can be lenses with a lesser optical density requirement than a primary lens (e.g., front and back cameras) used to produce the image. In such a situation, depth enabling lenses can intentionally be of lessor resolution, which can non-the-less share sensor space to minimize manufacturing costs and to maximize utilization of a rectangular shaped image sensor as described herein.

In embodiment 350, mixed shape sensor utilization is contemplated. In the embodiment two image circles 351, 352 can utilize a majority of the sensor 359 area. To optimize sensor 359 usage, two additional lenses can be utilized to direct light upon sensor 359 into a rounded rectangular shape to ensure optimization of sensor area.

System 370 can be an optical capture device able to maximize sensor 376 utilization by employing simultaneous non-overlapping image circles. System 370 can include additional components and is not limited to the exact arrangement disclosed herein.

Optical capture device 372 can be a hardware/software device with two or more lenses able to capture light from a surrounding real world environment and convey the light to an image sensor 353. In one instance, optical capture device 372 can be a 360 degree camera with two or more lenses (e.g., fish eye, wide angle, ultra wide angle). Device 372 can include characteristics such as aperture, focal length, depth of field, and the like. In one embodiment, device 372 can include a set of a fixed surround imaging components for capturing a field of view of between two hundred and seventy to three hundred and sixty degrees of a horizontal plane. For example, device 372 can include two diametrically opposing wide angle or ultra-wide angle lenses able to capture a field of view (FOV) of greater than 180 degrees. It should be appreciated that device 372 can include, but is not limited to, a pan capability, a tilt functionality, a zoom capability, and the like. In one embodiment, device 372 can include wired capabilities, wireless functionality, and the like. Device 372 can include, but is not limited to, lenses 373, optical waveguide 374, image sensor 356, power source 377, a processor, a bus, a non-volatile memory, a volatile memory, a data/power connector, a transceiver, and the like.

In one instance, device 372 can include software and/or firmware for processing sensor 376 image data, performing post processing functionality, and the like. In one instance, device 372 can perform image stitching, image interpolation, image correction, and the like. In one embodiment, device 372 can be communicatively linked with one or more computing devices which can permit communication of image data over a wired and/or wireless network.

In one embodiment, optical guides 374 can be placed between the lenses to direct light to assure the arrangement of the optical circles as described herein is achieved in contemplated embodiments. In one embodiment, guides 374 can be utilized to distort and/or deform image circles to achieve the distorted image circle shapes described herein.

In one instance, device 372 can include, but is not limited to, thermal imaging, infrared capabilities, low light functionality, and the like. In one embodiment, device 372 can include an array of lenses able to capture a high definition view of a real world environment. It should be appreciated that device 372 resolution can meet or exceed Standard Definition (SD), High Definition (HD), Quad HD/4K (QHD), and the like.

Lenses 373 can be a transmissive optical device that affects the focus of a light beam through refraction. Lenses 373 can include simple lenses, compound lenses, a lens array (e.g., lens stack), and the like. Lenses 373 can include, but is not limited to, biconvex, planoconvex, planoconcave, biconcave, positive meniscus, negative meniscus, and the like.

Optical waveguide 374 can be a spatially inhomogeneous structure for guiding light (e.g., for restricting the spatial region in which light can propagate). Waveguide 374 can include a region of increased refractive index, compared with the surrounding medium. Waveguide 374 can include, but is not limited to, planar waveguides guide (e.g., vertical direction guidance), channel waveguides guide (e.g., two dimensional guidance), and the like. For example, waveguide 374 can be an optical fiber waveguide.

Image sensor 376 can be a hardware/software element for converting an optical image into an electronic signal. Sensor 376 semiconductor charge-coupled devices (CCD), active pixel sensors in complementary metal-oxide-semiconductor (CMOS), N-type metal-oxide-semiconductor (NMOS, Live MOS) technologies, and the like. Sensor size and/or resolution can conform to traditional and/or proprietary form factors and/or resolutions. For example, sensor 376 can be a 1/3.2" rectangular sensor with a height of 4.54 millimeters and a width of 3.39 millimeters.

Power source 377 can be a hardware/software electrical and/or electro-chemical entity able to provide electricity to device 372, device 372 components, and the like. Power source 377 can include, but is not limited to, a battery, an electrical power source, and the like.

Drawings presented herein are for illustrative purposes only and should not be construed to limit the invention in any regard. It should be appreciated that the disclosure can utilize the Lensmaker's equation to establish an initial position lenses 373.

Figure 4:
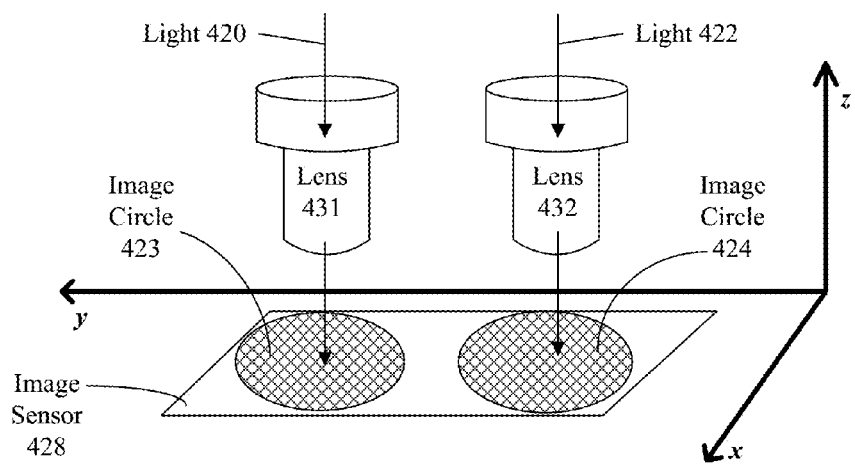
FIG. 4 is a schematic diagram illustrating an embodiment for maximizing effective surface area of a rectangular image sensor concurrently capturing image data from two lenses in accordance with an embodiment of the inventive arrangements disclosed herein.

FIG. 4 is a schematic diagram illustrating an embodiment 410 for maximizing effective surface area of a rectangular image sensor concurrently capturing image data from two lenses in accordance with an embodiment of the inventive arrangements disclosed herein.

A simplistic example of a camera utilizing the disclosure this is shown in embodiment 410. Two lenses 431, 432 can capture light 420, 422 from a surrounding environment. The light 420, 422 from the two lenses 431, 432 can strike the image sensor 428 as two adjacent concurrent non-overlapping image circles 423, 424.

It should be appreciated that embodiment 410 can illustrate an image sensor 428 oriented within a three dimensional Euclidian space. In one instance, the sensor 428 can lie horizontally (e.g., along an x-axis and y-axis) and lenses 431, 432 can be positioned vertically (e.g., along the z-axis). In the instance, optical pathways associated with lens 431, 432 can intersect with the sensor surface causing concurrent image circles 423, 424. It should be appreciated that the disclosure not limited to two lenses and can utilize an arbitrary number of lenses oriented with optical pathways normal to the sensor 428.

The flowchart and block diagrams in the FIGS. 1-4 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A digital optical device comprising:
a rectangular image sensor within an optical capture device; and
two lenses that capture and direct light from the real world environment upon the image sensor, wherein the light from each of the two lenses is concurrently directed to the same rectangular image sensor, wherein each of the two lenses to produce a corresponding image circle simultaneously on the rectangular image sensor, wherein an area of the image circles from the two lenses is non-overlapping, wherein the image sensor is a device which converts light within the real world environment into electronic signals, wherein a focal point of the image circles is within 5 percent of a diagonal line between opposing corners of the rectangular image sensor, wherein an outer perimeter of each image circle is within 5 percent of two different edges of the rectangular image sensor.

2. The optical device of claim 1, wherein the rectangular image sensor is a square image sensor.

3. The optical device of claim 1, wherein each of the image circles is an ellipse shape.

4. The optical device of claim 1, wherein each of the image circles is a circular shape.

5. The optical device of claim 1, wherein the focal point of the image circles is within 2 percent of the diagonal line between opposing corners of the rectangular image sensor, wherein the outer perimeter of each image circle is within 2 percent of two different edges of the rectangular image sensor.

6. The optical device of claim 1, wherein the lenses share an optical axis relative to the rectangular image sensor, wherein the image sensor is placed between 40 and 50 degrees of this optical axis to aligned the diagonal of a rectangular shape of the rectangular image sensor along the optical axis.

7. The optical device of claim 1, wherein the field of view of the two lenses is non-overlapping.

8. The optical device of claim 1, further comprising:
an optical waveguide configured to direct the light from each of the two lenses to non-overlapping portions of the rectangular image sensor.

9. A camera module comprising:
a rectangular image sensor within an optical capture device; and
two lenses within the optical capture device that capture and direct light upon the rectangular image sensor of the optical capture device concurrently, wherein the light from the two lenses strikes the rectangular image sensor in non-overlapping areas simultaneously, wherein the image sensor is a device which converts light within the real world environment into electronic signals, wherein a focal point of the non-overlapping areas is within 5 percent of a diagonal line between opposing corners of the rectangular image sensor, wherein an outer perimeter of each image circle is within 5 percent of two different edges of the rectangular image sensor.

10. The camera module of claim 9, wherein the rectangular image sensor is a square image sensor.

11. The camera module of claim 9, wherein each of the non-overlapping areas is an ellipse shape.

12. The camera module of claim 9, wherein each of the non-overlapping areas is a circular shape.

13. The camera module of claim 9, wherein the focal point of the non-overlapping areas is within 2 percent of the diagonal line between opposing corners of the rectangular image sensor, wherein the outer perimeter of each image circle is within 2 percent of two different edges of the rectangular image sensor.

14. The camera module of claim 9, wherein the lenses share an optical axis relative to the rectangular image sensor, wherein the rectangular image sensor is placed between 40 and 50 degrees of this optical axis to aligned the diagonal of the rectangular shape along the optical axis.

15. The camera module of claim 9, wherein the field of view of the two lenses is non-overlapping.

16. The camera module of claim 9, further comprising:
an optical waveguide configured to direct the light from each of the two lenses to non-overlapping portions of the rectangular image sensor.

17. A digital optical device comprising:
a rectangular image sensor within an optical capture device; and
two lenses that capture and direct light from the real world environment upon the image sensor, wherein the light from each of the two lenses is concurrently directed to the same rectangular image sensor, wherein each of the two lenses to produce a corresponding image circle simultaneously on the rectangular image sensor, wherein an area of the image circles from the two lenses is non-overlapping, wherein the image sensor is a device which converts light within the real world environment into electronic signals, wherein the lenses share an optical axis relative to the rectangular image sensor, wherein the rectangular image sensor is placed between 40 and 50 degrees of this optical axis to aligned the diagonal of a rectangular shape of the rectangular image sensor along the optical axis.

18. The optical device of claim 17, wherein the rectangular image sensor is a square image sensor.

19. The optical device of claim 17, wherein each of the image circles is an ellipse shape.

20. The optical device of claim 17, wherein each of the image circles is a circular shape.

\* \* \* \* \*